United States Patent
O'Sullivan et al.

(10) Patent No.: US 7,258,809 B2
(45) Date of Patent: Aug. 21, 2007

(54) MRAM WET ETCH METHOD

(75) Inventors: Eugene J. O'Sullivan, Nyack, NY (US); Daniel Worledge, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 261 days.

(21) Appl. No.: 11/147,513

(22) Filed: Jun. 8, 2005

(65) Prior Publication Data

US 2006/0289381 A1    Dec. 28, 2006

(51) Int. Cl.
  *B44C 1/22* (2006.01)
  *C03C 15/00* (2006.01)
  *C03C 25/68* (2006.01)
  *C23F 1/00* (2006.01)
(52) U.S. Cl. .......................................... 216/22; 216/57
(58) Field of Classification Search ............ 216/22, 216/57
See application file for complete search history.

(56) References Cited

U.S. PATENT DOCUMENTS 6,426,012 B1 * 7/2002 O'Sullivan et al. ........... 216/22
6,656,372 B2 * 12/2003 Yates ........................... 216/22

* cited by examiner

*Primary Examiner*—Parviz Hassanzadeh
*Assistant Examiner*—Roberts Culbert
(74) *Attorney, Agent, or Firm*—Scully, Scott, Murphy & Presser, P.C.; Ido Tuchman, Esq.

(57) ABSTRACT

An etching process is employed to selectively pattern the top magnetic film layer, the tunnel barrier, and the pinned bottom magnetic layer of a magnetic thin film structure. The pinned bottom magnetic film layer has an antiferromagnetic layer or a Ru spacer formed thereunder. The etching process employs various etching steps that selectively remove various layers of the magnetic thin film structure stopping on the antiferromagnetic layer or the Ru spacer. The progress of this etching process can be monitored by measuring the electrochemical potential difference of a part or wafer containing a magnetic structure with respect to a reference electrode simultaneously with the selective etching process.

18 Claims, 5 Drawing Sheets

MRAM WET ETCH METHOD

This application was sponsored by the United States Government under Contract No. MDA 972-99-C-0009, which was awarded by the Defense Advanced Research Projects Agency (DARPA); therefore, the United States Government has certain rights and privileges in the present application.

FIELD OF THE INVENTION

The present invention relates to the processing of magnetic thin film structures, and in particular to an etching process for selectively etching the exposed top magnetic layer, and the underlying tunnel barrier and pinned bottom magnetic layer of a magnetic random access memory (MRAM) stack.

BACKGROUND OF THE INVENTION

Figure 1:
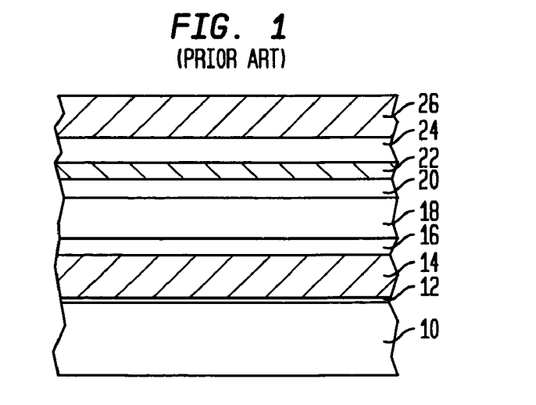
FIGS. 1-3 are pictorial views through cross-sections illustrating a typical prior art process of patterning a magnetic thin film structure.

MRAM has tremendous potential as a nonvolatile, solid-state memory to replace flash memory and electronically erasable programmable read-only memory (EEPROM). To enhance the performance of MRAM chips, it is necessary to reduce the lithographic minimum printable size. However, ion beam etching (IBE), a.k.a. ion milling, has been essentially the only method available for creating fine patterns, e.g., submicron patterns, in magnetic thin film structures. Because of the lack of volatile compounds for ferrous metals other than carbonyl, reactive-ion etching (RIE) has not been a viable technique for patterning thin magnetic films; and a RIE process based on carbonyl chemistry has not yet been developed. Thus, a chemical etching technique for patterning magnetic thin films based on Fe, Co and Ni is attractive because of the thin film nature of MRAM magnetic films (20-50 Å z-direction) relative to the x-y dimensions of patterned magnetic tunnel junction (MTJ) elements. The MRAM structure represents a complex multilayer system which includes numerous magnetic thin film layers. A typical MRAM structure is shown in FIG. 1. Specifically, the thin film structure shown in FIG. 1 comprises Si substrate 10, $SiO_x$ layer 12, a 150 Å Ti layer 14, $Ni_{81}Fe_{19}$ (40 Å) layer 16, $Ir_{20}Mn_{80}$ (120 Å) layer 18, $Co_{90}Fe_{10}$ (20 Å) layer 20, $Al_2O_3$ (10 Å) layer 22, $Ni_{81}Fe_{19}$ (40 Å) layer 24 and Ti (100 Å) layer 26. In this prior art magnetic structure, $Al_2O_3$ layer 22 serves as a tunnel barrier between the top magnetic film layer, i.e., $Ni_{81}Fe_{19}$ layer 24, and the pinned bottom magnetic layer, i.e., $Co_{90}Fe_{10}$ layer 20, the antiferromagnetic layer 18 and the magnetic layer 16 which are present beneath the tunnel barrier layer 22. Layer 26 is a passivating layer that prevents moisture, air or other contaminants from entering into the structure, while layer 14 is an adhesion layer. In the case of AP-pinned MTJs, the antiferromagnetic layer 18 can be a Ru spacer. The term "AP-pinned MTJs" is used herein to denote MTJs which contain an antiparallel-pinned (AP) layer structure, wherein the AP layer structure includes at least two pinned layers having magnetic moments that are self-pinned antiparallel to each other and the at least two pinned layers are separated by an AP coupling layer or a spacer.

Figure 2:
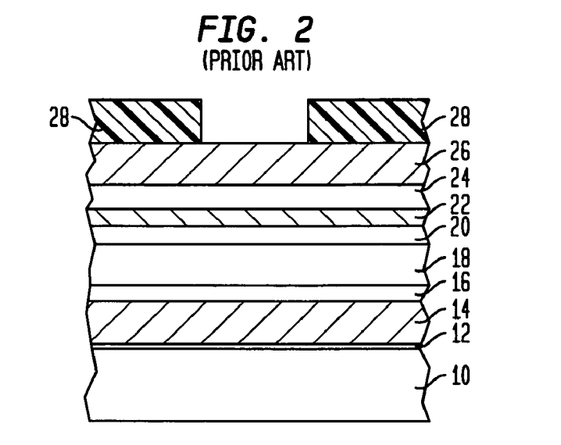
Figure 3:
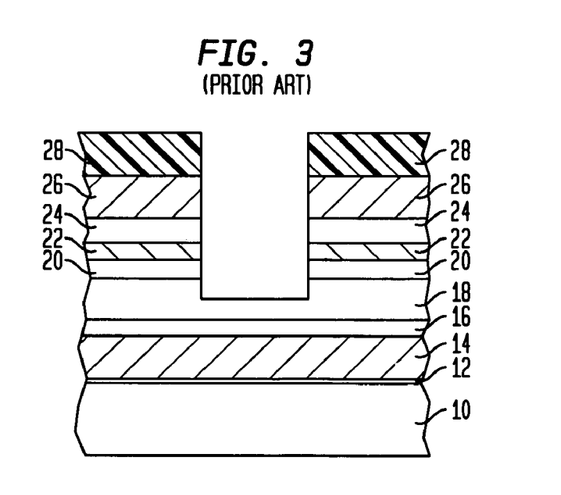

As is well known to those skilled in the art, the magnetic films of a MRAM structure, such as illustrated in FIG. 1, are quite thin. Patterning of prior art MRAM structures, such as shown in FIG. 1, is typically carried out by first applying a mask to the MRAM structure and patterning the mask by lithography (exposure and development). FIG. 2 shows the structure after these steps wherein reference number 28 represents the patterned mask. The pattern is transferred to the MRAM structure by RIE, IBE, or wet etching. And then the exposed $Ni_{81}Fe_{19}$ (40 Å) layer 24 can be pattern-wise etched by RIE, IBE, or wet etching. In a traditional wet etching process, a standard aqueous acid solution, such as sulfuric and/or nitric acid, is employed to etch the exposed $Ni_{81}Fe_{19}$ (40 Å) layer 24. Although the acid etchants are capable of etching through the exposed top magnetic layer 24 of the structure, the acid etchants are not selective for removing just that magnetic layer 24. Instead, when the acid etchants are employed, they also etch the underlying alumina tunnel barrier layer 22, the pinned $Co_{90}Fe_{10}$ layer 20, and the Mn in the $Ir_{20}Mn_{80}$ layer 18 of the magnetic thin film stack providing the structure shown in FIG. 3.

Despite being capable of etching numerous magnetic layers in a MRAM structure, the use of prior art aqueous acid solutions causes Galvanic-coupling-accelerated dissolution of the $CO_{90}Fe_{10}$ (20 Å) layer 20 which is coupled to an antiferromagnetic layer in simple-pinned MTJs and to a Ru spacer in AP-pinned MTJs. The term "simple-pinned MTJs" is used herein to denote MTJs which contain a single reference layer, wherein the single reference layer has its magnetization typically pinned by exchange coupling with an antiferromagnetic layer. In MRAM, due to coupled active magnetic layers and noble metals, avoidance of Galvanically-accelerated dissolution is a major concern.

U.S. Pat. No. 6,426,012 describes a method to pattern the magnetic soft layer of a MRAM structure while avoiding Galvanically-enhanced etching reactions. However, the carboxylic acids employed in U.S. Pat. No. 6,426,012 are weak acids, and thus are not capable of etching through the alumina tunnel barrier 22.

A desirable situation would be to selectively etch through the exposed top magnetic layer, i.e., layer 24, as well as the underlying thin $Al_2O_3$ layer 22, and the pinned bottom magnetic layer, i.e., layer 20, in the MRAM structure, and stop the etch process at the antiferromagnetic layer 18, while avoiding Galvanically-enhanced etching reactions. In the case of AP-pinned MTJs, the etching process stops at the Ru spacer of the AP-pinned layer structure. Such a method would leave the antiferromagnetic layer, in the case of simple-pinned MTJs, and the Ru spacer, in the case of AP-pinned MTJs, unetched.

To date, applicants are unaware of any etching process which selectively etches a magnetic thin film structure so as to stop on the antiferromagnetic layer, in the case of simple-pinned MTJs, or on the Ru spacer, in the case of AP-pinned MTJs, while avoiding Galvanic corrosion or Galvanically-assisted lateral etching of the edges of exposed magnetic layers. There is thus a need for developing an etching process which is capable of selectively etching a magnetic thin film structure to provide a patterned structure wherein the pattern is not formed in the antiferromagnetic layer, in the case of simple-pinned MTJs, or in the Ru spacer, in the case of AP-pinned MTJs. Such an etching process would be beneficial since it would prevent unwanted Galvanic corrosion of the inner magnetic layers, while being able to pattern the top magnetic film layer, the tunnel barrier layer, and the pinned bottom magnetic layer of the structure. The ability to etch down to an etch stop layer such as the antiferromagnetic layer or the Ru spacer further has advantages of superior process repeatability and avoiding the difficulties associated with stopping the etch process at alumina and leaving intact the pinned magnetic layer.

SUMMARY OF THE INVENTION

The present intention is directed to a method of selectively patterning the exposed top magnetic film layer, and the underlying tunnel barrier and the pinned bottom magnetic layer of a magnetic structure, stopping on the antiferromagnetic layer, in the case of simple-pinned MTJs, or on the Ru spacer, in the case of AP-pinned MTJs, in which the various etching processes employed do not adversely damage the antiferromagnetic layer or the Ru spacer that are present beneath the pinned bottom magnetic layer. The aforementioned object is achieved by utilizing a selective etching process. Specifically, the above object is obtainable utilizing processing steps that include:

(a) providing a magnetic structure comprising at least one pinned bottom magnetic film layer and at least one top magnetic film layer, wherein said at least one top and said at least one pinned bottom magnetic film layers are separated by a tunnel barrier layer, and said at least one top magnetic film layer has a passivating layer located thereon;

(b) forming a patterned resist atop said passivating layer, wherein a portion of said passivating layer is exposed;

(c) selectively etching said exposed portion of said passivating layer by a RIE process to expose a portion of said at least one top magnetic film layer; and (d) selectively etching said exposed portion of said at least one top magnetic film layer, and underlying portions of said tunnel barrier and said at least one pinned bottom magnetic film layer by a wet etch process which includes an etchant solution comprising an arylsulfonic acid and an aliphatic or alicyclic amine.

The present intention is also directed to a method of monitoring the progress of a selective etching process and determining the etch endpoint of said selective etching process, which comprises measuring the electrochemical potential difference of a part or wafer containing a magnetic structure with respect to a reference electrode simultaneously with the selective etching process.

DESCRIPTION OF THE INVENTION

The present invention, which provides a method for selectively etching the top magnetic layer, the tunnel barrier, and the pinned bottom magnetic layer of a magnetic thin film structure, without adversely affecting the antiferromagnetic layer, in the case of simple-pinned MTJs, or the Ru spacer, in the case of AP-pinned MTJs, will now be described in more detail by referring to the drawings that accompany the present application. It is noted that the drawings of the present invention are provided for illustrative purposes and thus they are not drawn to scale.

Figure 4:
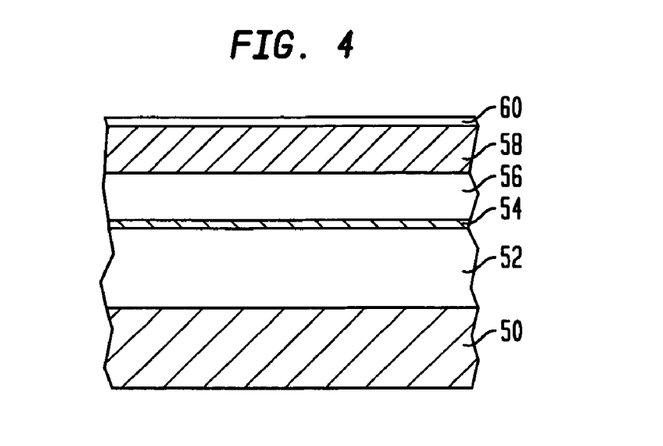
FIGS. 4-8 are pictorial views through cross-sections illustrating the basic processing steps of the present invention which are used in patterning a magnetic thin film structure.

Reference is first made to FIG. 4 which includes a portion of a magnetic thin film structure that can be utilized in the present invention. Specifically, the portion of the magnetic structure shown in FIG. 4 includes at least one pinned bottom magnetic thin film layer 52 and at least one top magnetic film layer 56 which are separated by a tunnel barrier layer 54. The upper most surface layer of the at least one top magnetic layer 56 has a passivating layer 58 formed thereon and the passivating layer 58 includes a surface oxide 60. In the case of simple-pinned MTJs, the at least one pinned bottom magnetic thin film layer 52 has an antiferromagnetic layer 50 formed thereunder. In the case of AP-pinned MTJs, the at least one pinned bottom magnetic thin film layer 52 has a Ru spacer 50 formed thereunder. The portion of the magnetic thin film structure shown in FIG. 4 may further include a semiconductor substrate, a $SiO_x$ layer, a Ti layer, another magnetic film layer, or other adhesion layers which would be located beneath the antiferromagnetic layer 50, in the case of simple-pinned MTJs, or the Ru spacer 50, in the case of AP-pinned MTJs. When these elements are present, the magnetic thin film structure would look similar to the one depicted in FIG. 1. For clarity, however, the material layers located beneath the antiferromagnetic layer 50, in the case of simple-pinned MTJs, or the Ru spacer 50, in the case of AP-pinned MTJs, are not shown in FIGS. 4-8.

The portion of the magnetic thin film structure illustrated in FIG. 4 is formed utilizing conventional techniques well known in the art that are capable of forming such a structure. For example, the various magnetic and non-magnetic layers may be formed by utilizing the same or different deposition process including, for example, chemical vapor deposition (CVD), plasma-assisted CVD, plating, evaporation, sputtering, chemical solution deposition and other like deposition processes.

The top and pinned bottom magnetic film layers (56 and 52, respectively) of the illustrated structure may be composed of the same or different magnetic layers in which each individual layer has a thickness of less than 150 Å. Preferably, each individual magnetic film layer (52 or 56) has a thickness of less than 100 Å.

Illustrative examples of magnetic films that can be employed in the present invention as layers 52 or 56 include, but are not limited to: $Ni_xFe_y$, $Ni_xCo_yFe_z$ and other like magnetic films. In the above formulas, x, y, and z are any integers whose sum adds up to 100. In accordance with the present invention, the pinned bottom magnetic film layer 52 as well as the top magnetic film layer 56 may comprise only one magnetic film or they may comprise a stack of magnetic films.

In one embodiment of the present invention, the top magnetic film layer 56 is comprised of a Permalloy layer, i.e., a $Ni_xFe_y$, or $Co_xFe_y$ layer, while the bottom magnetic film layer 52 comprises a stack consisting of $Ni_xFe_y$ and $Co_xFe_y$.

The antiferromagnetic layer 50 may be composed of $H_xMn_y$, wherein H is a noble metal and x, and y are any integers whose sum adds up to 100.

Illustrative examples of antiferromagnetic layers 50 that can be employed in the present invention include, but are not limited to: $Ir_{20}Mn_{80}$ or $Pt_{50}Mn_{50}$ and other like noble metal-containing antiferromagnetic layers.

In one embodiment of the present invention, any exposed edge of the magnetic structure may be coated with a conventional passivating material so as to prevent certain underlying films, notably the noble metal containing exchange bias layer from engaging in Galvanic type reactions that could inhibit the etching process.

The tunnel barrier layer 54 employed in the present invention includes any conventional material layer such as $Al_2O_3$ which is capable of sustaining a tunneling current and which does not chemically degrade the properties of the top and pinned bottom magnetic layers (56 and 52, respectively). In some instances, the tunnel barrier layer 54 may also serve as a diffusion barrier. The tunnel barrier layer 54 employed in the present invention is a thin layer which typically has a thickness of less than about 15 Å.

The passivating layer 58 employed in the present invention includes any metal layer such as Ti, TiN, Ta, or TaN which serves as a barrier layer preventing diffusion of moisture, air and other contaminants from contacting with the underlying magnetic layers and the tunnel barrier layer 54. The thickness of this layer may vary, but typically the passivating layer 58 has a thickness from about 20 to about 1000 Å.

As indicated above, the passivating layer 58 contains a surface oxide 60 which is located on the upper surface of the passivating layer 58 when the structure is exposed to air.

Figure 5:
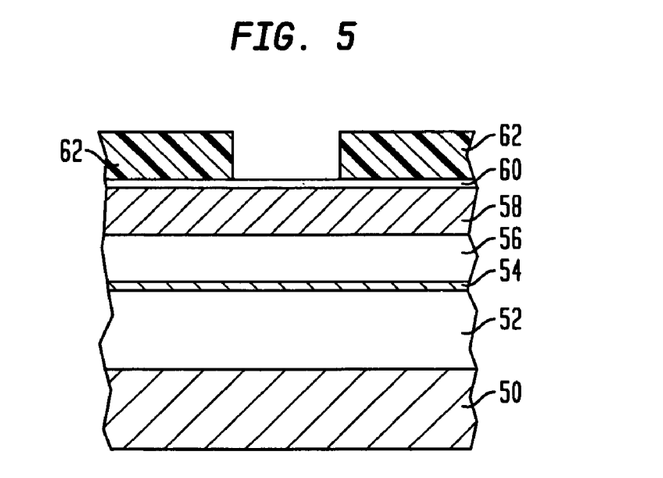
Figure 6:
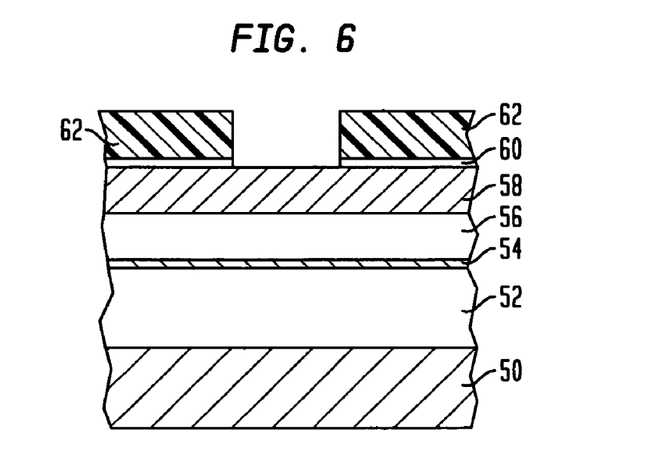
Figure 7:
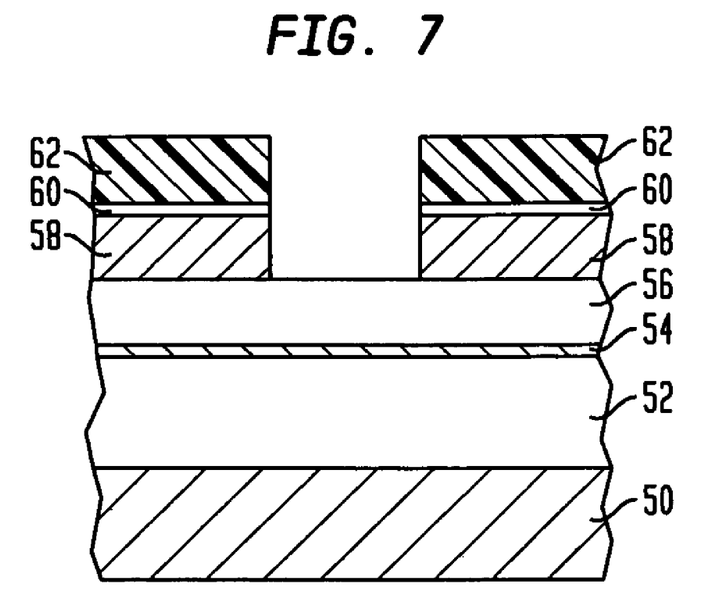

Next, and as illustrated in FIG. 5, patterned resist 62 is formed on the surface oxide 60 present on the passivating layer 58 as shown in FIG. 4 utilizing conventional lithography. Specifically, the lithography process includes: (i) applying a conventional resist to the surface oxide 60 of the passivating layer 58 via a conventional deposition process such as spin-on coating, dip coating, CVD, plasma-assisted CVD, evaporation and chemical solution deposition; (ii) exposing the resist to radiation to form a desired pattern therein; and (III) developing the desired pattern using a conventional developer solution to expose a portion of the surface oxide 60 on the passivating layer 58.

Following the formation of the patterned resist, the inventive etching process, which will be described in more detail below, is performed. First, the exposed surface oxide 60, not protected with the patterned resist 62, is removed by utilizing a reactive-ion etching (RIE) process providing the structure shown FIG. 6. The RIE process may include $CF_4$/Ar or $CBrF_3/SF_6$ as etchant gases. Any suitable RIE process may be used, such as the process disclosed in U.S. Pat. No. 6,426,012; the entire content of which is incorporated herein by reference. Those skilled in the art can ascertain the suitable conditions without undue experiments. As is illustrated, this etching step exposes a portion of the passivating layer 58.

In one embodiment of the present invention, an optional oxygen ashing process is performed prior to removing the exposed surface oxide 60. The optional oxygen ashing process includes the use of oxygen ashing conditions well known to those skilled in the art that are capable of removing any etched resist residue from the exposed surface of the surface oxide 60 of the passivating layer 58. In another embodiment of the present invention, a conventional oxygen ashing process which is capable of removing any fluorine-related resist residue may be performed after conducting the above described RIE steps.

Next, the exposed portion of the passivating layer 58 that does not include any inert surface oxide layer is subjected to a suitable etching process that includes the use of RIE process. Any suitable etching process may be used, such as the etching process disclosed in U.S. Pat. No. 6,426,012. Those ordinarily skilled in the art can ascertain the suitable conditions without undue experiments. In this step of the present invention, the passivating layer 58 is selectively patterned so as to expose a portion of the at least one top magnetic film layer 56, See FIG. 7.

Alternatively, and when a Ta (or TaN) passivating layer 58 is employed, the above wet etching step may be replaced with a $SF_6$ RIE plasma etching process. The use of $SF_6$ RIE plasma etching to remove the Ta (or TaN) passivating layer 58 also modifies the surface of the exposed magnetic layer 56 to include sulfur. Alternatively, another RIE etchant gas which removes Ta (or TaN) could be used first and thereafter the etched surface is treated with a $SF_6$ gas.

The presence of sulfur on a magnetic thin film layer 56 is advantageous since sulfur-containing magnetic film layers etch at a much faster rate than magnetic film layers which does not include sulfur fragments.

Figure 8:
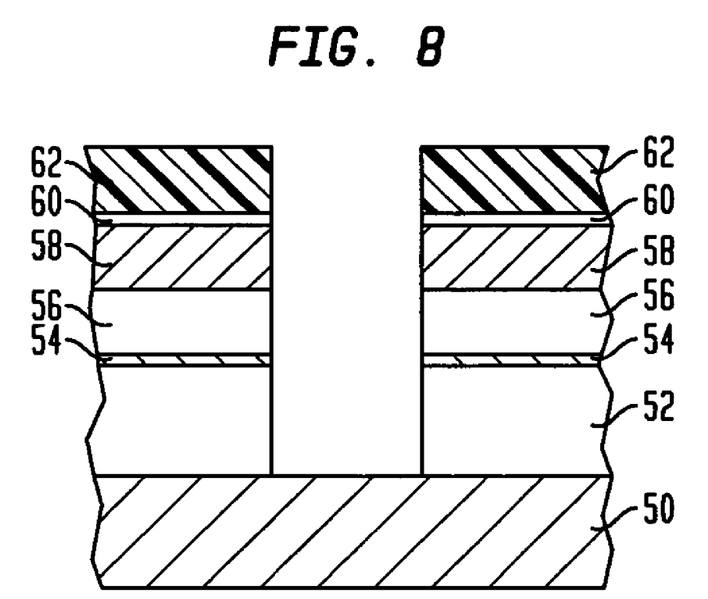

FIG. 8 shows the next step of the present invention in which exposed top magnetic layer 58, as well as the underlying tunnel barrier 54, and the bottom magnetic layer 52, are selectively etched utilizing an etching process that is capable of stopping on the antiferromagnetic layer 50, in the case of simple-pinned MTJs, or on the Ru spacer 50, in the case of AP-pinned MTJs. In this step of the present invention, the exposed top magnetic film layer 56, the underlying tunnel barrier 54, and the bottom magnetic layer 52, are selectively etched utilizing the inventive etchant solution that comprises an arylsulfonic acid or a salt thereof and an aliphatic or alicyclic amine. By "an arylsulfonic acid or a salt thereof", it is meant a sulfonic acid derivative that is substituted with an aryl group or any metal salt of such an arylsulfonic acid. By "an aliphatic amine" it is meant an amine derivative that is substituted with a hydrocarbon compound having an open-chain structure. By "an alicyclic amine" it is meant an amine derivative that is substituted with a hydrocarbon compound that contains a ring, but is not aromatic. In a preferred embodiment of the present invention, the salt thereof is an alkali metal salt of the arylsulfonic acid.

The arylsulfonic acids suitable for the present invention include nitrobenzene sulfonic acids having one of the following structures:

wherein R1, R2, R3, and R4 are the same or different, and are independently hydrogen, $C_1$-$C_3$ alkyl, halogen, amino, or hydroxyl group.

Illustrative examples of arylsulfonic acids and salts thereof that can be employed in the present invention include, but are not limited to: 3-nitrobenzene sulfonic acid, a.k.a. m-nitrobenzene sulfonic acid; 4-chloro-3-nitrobenzene sulfonic acid; sodium 3-nitrobenzene sulfonate; 4-nitrobenzene sulfonic acid; 2-methyl-5-nitrobenzene sulfonic acid; 2-amino-4-nitrophenol-6-sulfonic acid; 2-nitrobenzene sulfonic acid; 2-chloro-5-nitrobenzene sulfonic acid; 3-amino-4-hydroxy-5-nitrobenzene sulfonic acid; and 3-amino-2-hydroxy-5-nitrobenzene sulfonic acid. In a preferred embodiment of the present invention, the arylsulfonic acid is m-nitrobenzene sulfonic acid. In one embodiment of the inventive etchant solution, the arylsulfonic acid is m-nitrobenzenesulfonic acid (NBSA).

The aliphatic or alicyclic amines suitable for the present invention include primary, secondary, and tertiary amines. Illustrative examples of aliphatic or alicyclic amines that can be employed in the present invention include, but are not limited to: propylamine, ethylenediamine, diethylenetriamine, triethylenetetramine and other analogous amines. It is understood to one skilled in the art that triethylenetetramine can be linear, branched, cyclic, or a mixture thereof. In one embodiment of the inventive etchant solution, the aliphatic or alicyclic amine is ethylenediamine.

The inventive etchant solution may further comprise dissolved $O_2$. The dissolved $O_2$ is at an equilibrium concentration due to air atmosphere. The inventive etchant solution includes a mole ratio of the arylsulfonic acid to the aliphatic or alicyclic amine from about 1:3 to about 1:20, with a mole ratio of the arylsulfonic acid to the aliphatic or alicyclic amine from about 1:6 to about 1:10 being more preferred. The etchant solution typically comprises from about 0.1 to m parts by weight of an arylsulfonic acid per 100 parts by weight water where m is limited by the solubility of the acid. Typically, the pH of the inventive etchant solution is from about 5 to about 10, with the pH of about 6.5 to about 8.5 more preferred. In one embodiment of the present invention, the pH of the inventive etchant solution is about 7.5.

This etching step is typically carried out at temperature of about 40° to about 50° C. for a period of time from about 3 to about 12 minutes, depending on the source and type of parts, the condition of the free top magnetic layer 56, and the thickness of the tunnel barrier layer 54.

Figure 9:
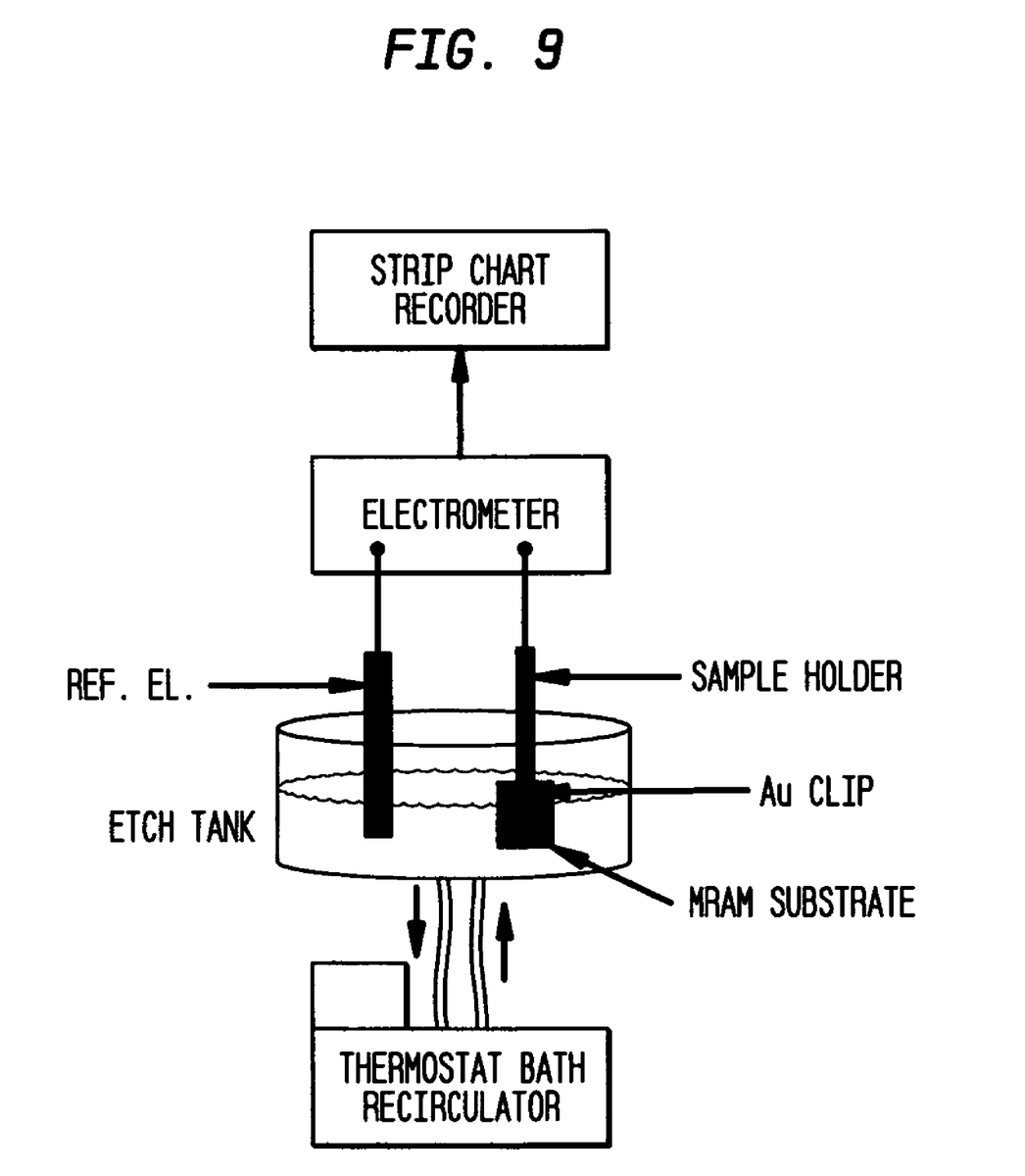
FIG. 9 is a schematic illustration of a typical wet etching experimental setup that can be employed in the present invention.

The progress of a selective etching process, such as the above etch step, may be monitored by measuring the electrochemical potential difference of a part or wafer containing a magnetic structure with respect to a reference electrode simultaneously with the selective etching process. FIG. 9 shows a typical experimental setup of the inventive wet etching process. A typical reference electrode is Ag/AgCl electrode. In one embodiment, the etch tank is a thermostatted jacketed polymer tank for 200 mm substrates. In another embodiment, the etch tank is a thermostatted jacketed Pyrex tank with magnetic stirring for preparing conducting atomic force microscopy (CAFM) parts. The etchant solution is preferably pre-filtered using 0.2 μm filter.

Figure 10:
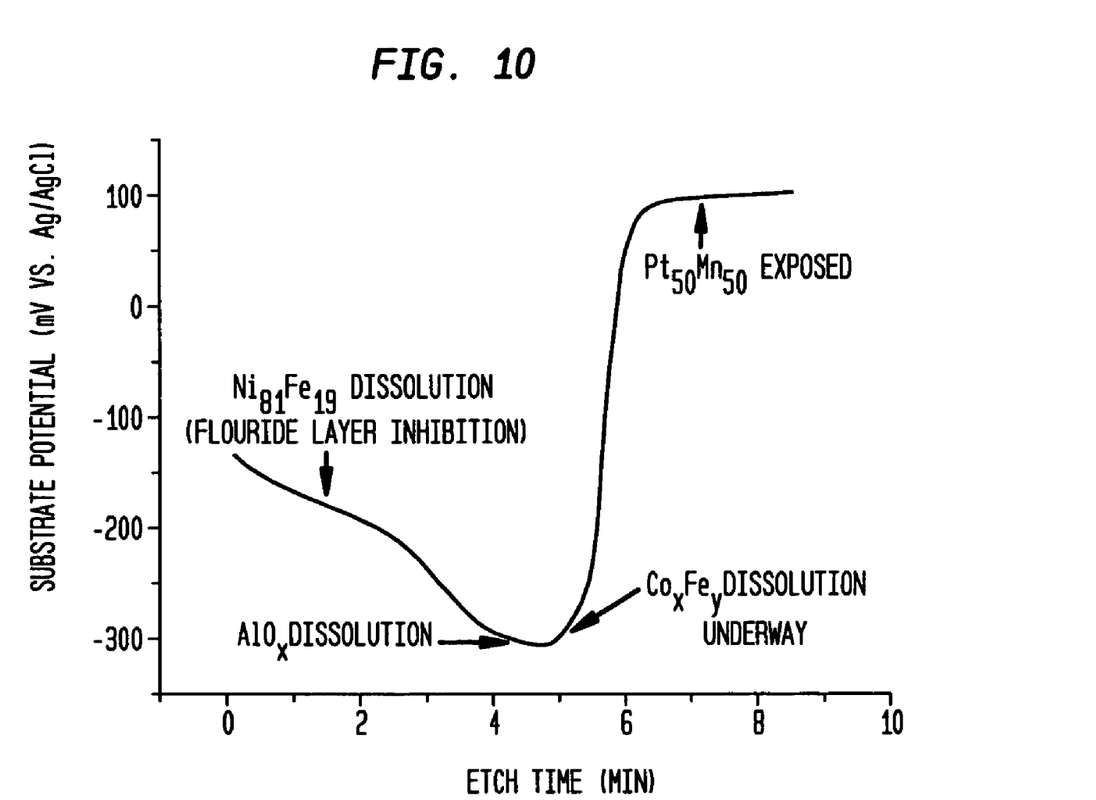
FIG. 10 is a graph plotting substrate potential (mV v. Ag/AgCl) v. time (minute) illustrating a typical Open Circuit Potential ($E_{oc}$) v. Time curve of one embodiment of the present invention.

The etch endpoint of the selective etching process, such as the above etch step, may be determined by measuring the electrochemical potential difference of a part or wafer containing a magnetic structure with respect to a reference electrode simultaneously with the selective etching process. FIG. 10 shows the curve of substrate potential v. etch time for one embodiment of simple pinned MTJs etched in NBSA/ethylenediamine solution at 45° C. The curve exhibits a steady decrease in substrate potential when the $Ni_{81}Fe_{19}$ top layer is dissolved, and reaches the bottom when the $AlO_x$ layer is dissolved. While dissolution of $Co_xFe_y$ layer is underway, the curve exhibits a rapid rise in substrate potential. When $Pt_{50}Mn_{50}$ layer is exposed, the oblique curve becomes a plateau in substrate potential. The characteristic of exposed $Pt_{50}Mn_{50}$ is the etch endpoint of this etching process.

The application of the novel electrochemical monitoring technique for determining etch endpoint enables the inventive wet etch method can be used for preparing samples for routine CAFM screening tests, and the ability of the inventive wet etch method to etch past the tunnel barrier and minimize or eliminate Galvanic corrosion effects are consistently demonstrated.

Following the third etching step of the present invention, the patterned structure may be rinsed with a suitable inert solvent or supercritical fluid and the patterned resist may then be stripped utilizing any well known stripping process. The patterned magnetic structure may then be subjected to conventional MRAM processing techniques also well known to those skilled in the art.

While this invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but all within the scope of the appended claims.

Having thus described our invention in detail, what we claim as new and desire to secure by the Letters Patent is:

1. A method of selectively patterning a magnetic film structure comprising:
   (a) providing a magnetic structure comprising at least one pinned bottom magnetic film layer and at least one top magnetic film layer, wherein said at least one top and said at least one pinned bottom magnetic film layers are separated by a tunnel barrier layer, and said at least one top magnetic film layer having a passivating layer located thereon;
   (b) forming a patterned resist atop said passivating layer, wherein a portion of said passivating layer is exposed;
   (c) selectively etching said exposed portion of said passivating layer by a RIE process to expose a portion of said at least one top magnetic film layer; and
   (d) selectively etching said exposed portion of said at least one top magnetic film layer, and underlying portions of said tunnel barrier and said at least one pinned bottom magnetic film layer by a wet etch process which includes an etchant solution comprising an arylsulfonic acid and an aliphatic or alicyclic amine.

2. The method of claim 1 wherein said at least one top magnetic film layer and said at least one pinned bottom magnetic film layer are the same or different, and are $Ni_xFe_y$, $Ni_xCo_yFe_z$, or $Co_xFe_y$ wherein x, y and z are any integers whose sum adds up to 100.

3. The method of claim 1 wherein said at least one top magnetic layer is $Ni_xFe_y$ and the at least one pinned bottom magnetic film layer is $Ni_xFe_y$, or $Co_xFe_y$.

4. The method of claim 1 wherein said at least one pinned bottom magnetic film layer has an antiferromagnetic layer formed thereunder.

5. The method of claim 4 wherein said antiferromagnetic layer is $H_xMn_y$, wherein H is a noble metal and x and y are any integers whose sum adds up to 100.

6. The method of claim 4 wherein said antiferromagnetic layer is $Ir_xMn_y$, or $Pt_xMn_y$ wherein x and y are any integers whose sum adds up to 100.

7. The method of claim 1 wherein said at least one pinned bottom magnetic film layer has a Ru spacer formed thereunder.

8. The method of claim 1 wherein said passivating layer is one of Ti, Ta, TiN or TaN.

9. The method of claim 1 wherein said tunnel barrier layer is $Al_2O_3$.

10. The method of claim 1 wherein step (c) is replaced by step (c') which includes selectively etching said exposed portion of said passivating layer by $SF_6$ RIE plasma etching.

11. The method of claim 1 wherein said arylsulfonic acid in the etchant solution employed in step (d) has one of the following structures:

wherein R1, R2, R3, and R4 are the same or different, and are independently hydrogen, $C_1$-$C_3$ alkyl, halogen, amino, or hydroxyl group.

12. The method of claim 1 wherein said arylsulfonic acid or a salt thereof in the etchant solution employed in step (d) is selected from the group consisting of m-nitrobenzene sulfonic acid, 4-chloro-3-nitrobenzene sulfonic acid; sodium 3-nitrobenzene sulfonate; 4-nitrobenzene sulfonic acid; 2-methyl-5-nitrobenzene sulfonic acid; 2-amino-4-nitrophenol-6-sulfonic acid; 2-nitrobenzene sulfonic acid; 2-chloro-5-nitrobenzene sulfonic acid; 3-amino-4-hydroxy-5-nitrobenzene sulfonic acid; and 3-amino-2-hydroxy-5-nitrobenzene sulfonic acid.

13. The method of claim 1 wherein said aliphatic or alicyclic amine in the etchant solution employed in step (d) is selected from the group consisting of propylamine, ethylenediamine, diethylenetriamine, and triethylenetetramine.

14. The method of claim 1 wherein said etchant solution employed in step (d) further comprising dissolved $O_2$, wherein said dissolved $O_2$ is at an equilibrium concentration under air atmosphere.

15. The method of claim 1 wherein said etchant solution employed in step (d) has a pH of about 5 to about 10.

16. The method of claim 1 wherein step (d) is conducted at a temperature of about 40°-50° C.

17. The method of claim 1 wherein said etchant solution employed in step (d) is pre-filtered.

18. The method of claim 1 wherein said arylsulfonic acid and said aliphatic or alicyclic amine are present in said etchant in a mole ratio from about 1:3 to about 1:20, respectively.

* * * * *